United States Patent [19]

Ekholm et al.

[11] Patent Number: 4,731,293

[45] Date of Patent: Mar. 15, 1988

[54] FABRICATION OF DEVICES USING PHOSPHORUS GLASSES

[75] Inventors: David T. Ekholm, Mountainside; William H. Grodkiewicz, Glen Gardner; Bertram Schwartz, Westfield; Shobha Singh, Summit; LeGrand G. Van Uitert, Morris Township, Morris County; George J. Zydzik, Columbia, all of N.J.

[73] Assignee: American Telephone and Telegraph Company, AT&T Bell Laboratories, Murray Hill, N.J.

[21] Appl. No.: 876,442

[22] Filed: Jun. 20, 1986

[51] Int. Cl.[4] ............................................. B32B 17/06
[52] U.S. Cl. ............................... 428/426; 204/192.15; 204/192.25; 427/42; 427/376.2; 428/428; 428/432; 437/20; 437/37
[58] Field of Search ................ 427/42, 38, 82, 93, 427/248.1, 376.2; 428/428, 432, 426; 204/192 SP, 192 S, 192 D, 192.15, 192.25

[56] References Cited

U.S. PATENT DOCUMENTS

| | | | |
|---|---|---|---|
| 3,276,902 | 10/1966 | Abraham | 427/42 |
| 3,801,356 | 4/1974 | Mulfinger et al. | 427/42 |
| 3,836,393 | 9/1974 | Ernsthausen et al. | 427/42 |
| 4,104,418 | 8/1978 | Park et al. | 427/42 |
| 4,374,391 | 2/1983 | Camlibel | 204/192 D |
| 4,407,061 | 10/1983 | Grodkiewicz | 427/248.1 |

OTHER PUBLICATIONS

*Journal of Applied Physics*, 37, pp. 574–579 (1966).

Primary Examiner—Sadie L. Childs
Attorney, Agent, or Firm—Walter G. Nilsen

[57] ABSTRACT

A fabrication technique is described for making various devices in which a type of glass is used as a surface protection layer. The glass layers are put down by particle bombardment (generally sputtering or e-beam bombardment) of a phosphorus-containing silicate glass target. Devices with such layers are also described. Such glass layers are highly advantageous as encapsulating material, diffusion barrier layers, etc., particularly for optical type devices and certain semiconductor devices. Particularly important is the preparation procedure for the glass target used in the bombardment process. The glass layers are moisture stable, act as excellent barriers against diffusion, and are usable up to quite high temperatures without cracking or peeling. The glass layers also provide long-term protection against atmosphere components including water vapor, oxygen, atmosphere pollution contaminants, etc.

16 Claims, 8 Drawing Figures

FABRICATION OF DEVICES USING PHOSPHORUS GLASSES

TECHNICAL FIELD

The invention is a process for making a device in which a certain type of glass is used and devices made by such processes.

BACKGROUND OF THE INVENTION

The fabrication of some devices often requires capping layers for surface protection and pattern delineation. Such surface layers are useful during fabrication as well as on completed devices. Requirements for such films differ widely depending on the particular fabrication procedure, material, etc. Usually, adherence, stability (particularly toward moisture), and effectiveness as a diffusion barrier are of principal importance. Also, stability, adherence, etc., at high temperatures are desirable where high temperatures are used during fabrication of the device or on subsequent use of the device. In addition, with some applications and fabrication procedures, it might be advantageous for the protective layer to be at least partially transparent to radiation including radiation in the infrared, visible, ultraviolet, X-ray and gamma ray regions. Also, stress conditions imposed by the glass layer are critical to the use of various glass layers particularly where heat treatment of semiconducting compounds containing dopants is involved.

Optical devices are becoming of increasing importance principally because of the development of optical communications systems and certain types of display systems. Because of these developments, various optical devices including semiconductor optical devices are becoming increasingly important so that economic and effective techniques for manufacturing such devices are in great demand. Coatings that are suitable for use on optical devices including semiconductor optical devices are highly desirable. Such coatings should be stable, unaffected by ordinary atmosphere substances such as moisture, chemicals, etc., adherent and be able to withstand temperatures used to fabricate the devices or in the use of the devices. In many devices, the coating should also be transparent at various parts of the radiation spectrum. Where the coating is used to encapsulate optical devices, it should be transparent to the part of the radiation spectrum where they operate. Exemplary optical devices are light emitting diodes, lasers and optical detectors. Coatings are often used as barrier layers in annealing procedures and various other heat-treatment procedures. Here, the layers should prevent diffusion of semiconductor material out through the glass layers of diffusion of doping material out through the layer or into the semiconductor material either through or from the glass layer. Often, the thermal expansion properites of the glass layer also plays an important role in the heat-treatment procedure.

It should be remarked that the term "optical" is used in a broad sense and is not limited to visible radiation. The term optical radiation refers to any useful radiation and includes infrared radiation, untraviolet radiation, X-ray and gamma ray radiation, etc.

In the fabrication of some devices it is advantageous to have protective layers that are transparent to radiation. For example, it might be advantageous to observe the surface under the protective layer during device fabrication or at various steps during device fabrication.

Typical semiconductor optical devices have been described in a variety of references including *Light Emitting Diodes* by A. A. Bergh and P. J. Dean, Clarenden Press, 1976, and *Injection Electroluminescent Devices* by C. H. Gooch, John Wiley and Sons, New York, 1973; and *Semiconductors and Semimetals*, edited by R. K. Willardson and A. C. Beer, Academic Press, 1966, Vol. 2, *Physics of III-V Compounds*. Such devices include semiconductor lasers, opto-isolators, light emitting diodes, light detectors, solar cells, etc.

A particularly rapid development has been occurring in the last few years in semiconductor optical devices. Much of this development is related to improving lifetime performance of semiconductor lasers, improving the performance of avalanche photodetectors and related semiconductor optical devices. Other developments are related to the extension of interest toward lower optical frequencies (principally in the infrared region) where some optical systems (i.e., optical communication systems) exhibit superior performance. Also, a greater variety of materials are being considered for these devices so as to improve performance. Often, these materials require surface protection either during fabrication of the device or when the completed device is being used. Also of increasing importance is the fabrication of other (non-optical) III-V semiconductor devices as well as all types of II-VI semiconductor devices. More efficient, cheaper, faster fabrication of these devices is also highly desirable.

Sample preparation of glasses for use as targets in particle bombardment deposition procedures has been described in a number of publications. For borosilicate glass, such a procedure has been described by I. Camlibel et al in U.S. Pat. No. 4,374,391, issued Feb. 15, 1983.

SUMMARY OF THE INVENTION

The invention is a process for making semiconductor devices in which certain phosphorus containing silicate glasses are used as protection or barrier layers during the fabrication process. The phosphorus containing glass layers may be used as barrier layers in a diffusion procedure, as an encapsulating layer during annealing or as a passivation layer in the completed device.

Although the exact reason why these glasses serve as such good diffusion barriers is not completely understood, it is believed to depend on two things. First, the presence of phosphorus (and certain other elements) prevents out-diffusion of the group III element (gallium in the case of gallium arsenide) which in turn prevents further diffusion of impurity or doping elements in the group III-V compound semiconductor. Also, the inclusion of phosphorus and certain other elements in the silicon glass composition increases the thermal expansion coefficient of these glasses over that of $SiO_2$ so as to ensure good adhesion to the semiconductor surface.

The phosphosilicate glass is prepared by a special procedure involving a heat treatment at high temperatures. The phosphosilicate glass is deposited by a particle beam method, preferably by e-beam deposition. Composition of the phosphosilicate glass layer deposited on the surface may vary over large limits, dependent on substrate temperature, but generally 1–12 mole percent $P_2O_5$ is a useful range. Also, other components may be present in the glass; e.g., up to 5 mole percent other stable ingredients such as boron, rare earth, etc. Generally, at least 60 mole percent is silica. Most preferred is phosphosilicate glass with only nominal amounts of added ingredients (less than about 1 mole percent) but 5 or even 10 mole percent may yield good results. Usually boron is preferred as the added ingredient. Particularly advantageous is the use of phosphosilicate glass layers on the surface of III-V semiconductor compounds during heat treatment procedures. Such heat treatment procedures are often used as part of an ion implantation procedure to anneal damage caused by the implantation and activate the implanted material. Also included in the invention are devices made in accordance with the inventive process. Such devices have a number of unique features including high surface integrity, passivating layers made of the phosphosilicate glass, unique doping profile, etc. Such devices exhibit unusually advantageous properties such as low dark current, low damage from ion implantation, etc. Particularly advantageous is the sharp, shallow doping profile which has a number of advantages for various devices including low pinch-off voltage for FETs etc.

DETAILED DESCRIPTION

Figure 1:
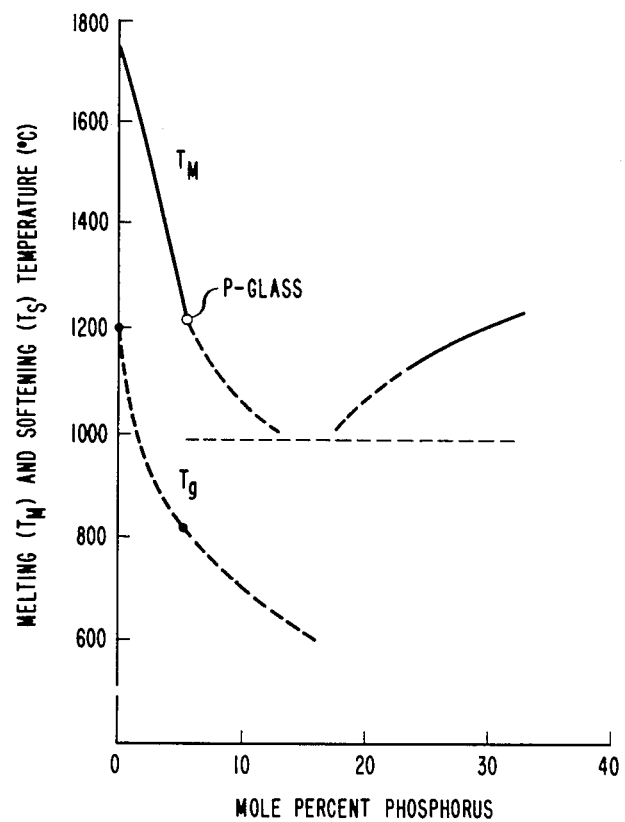
FIG. 1 is a graph showing data on the reduction of softening temperature of silicate glass and the reduction in melting point for the comparable crystalline material with increasing amounts of phorphorus.
Figure 2A:
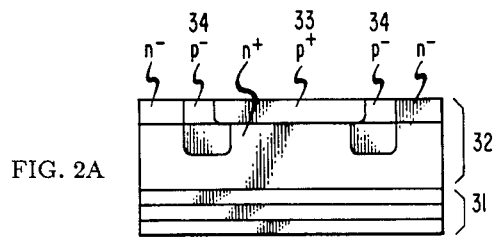
FIG. 2 shows several side views of an avalanche photodetector in different stages of fabrication.
Figure 2B:
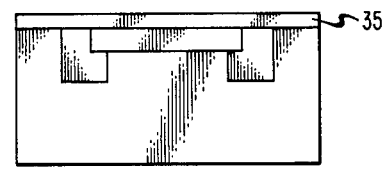
Figure 2C:
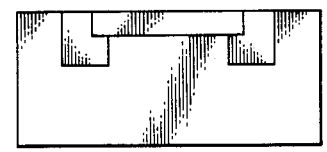
Figure 2D:
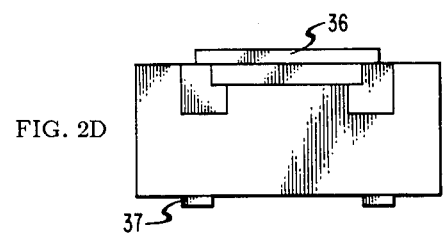

The invention is based on the discovery that phosphosilicate glass layer made by a specific procedure and with a certain composition range and deposited by a particle-beam deposition procedure (e.g., e-beam deposition) have unusually good properties as a barrier or encapsulating layer during processing or as a passivating layer on devices comprising III-V semiconductor compounds (e.g, GaAs, InP, etc.). Also of particular interest are III-V compounds which are lattice matched to either InP or GaAs such as InGaAs, InGaAsP, AlInAs, AlInAsP, etc. In these deposition procedures, a phosphorus containing glass target is made by a specific procedure, and this target is used in the particle deposition procedure. Typical particle deposition procedures are e-beam deposition and sputtering.

Electron beam deposition is described in a number of references including *Physical Vapor Deposition* published by Airco Temescal (a division of Airco, Inc.), 2850 Seventh Street, Berkeley, Calif. 94710. Sputtering is also described in a number of references including D. D. Davidse and L. I. Maissel in the *Journal of Applied Physics*, 37, pp. 574–79, 1966. The e-beam procedure is preferred because the surface of the semiconductor on which the glass is being deposited is less likely to be damaged and the deposition process involving e-beam is less likely to involve contamination of the semiconductor surface.

As mentioned above, glass target preparation and composition are of primary importance in the practice of the invention. Generally, the initial composition is within the range of 2–25 mole percent $P_2O_5$. this range insures good melting of the glass during heat treatment. On deposition, the $P_2O_5$ content changes little if the semiconductor substrate is cold but may be reduced by as much as one-half when the substrate is heated above 250 degrees C. during the run. Such losses tend to reduce the $P_2O_5$ range to 1 to 12 mole percent. Preferred composition of the glass layer on the semiconductor surface is 2–8 mole percent $P_2O_5$ with 3–6 most preferred. Although other oxides may be present in amounts up to 5 or 10 mole percent, less than one percent is preferred. The remainder of the glass is silicon dioxide.

The target preparation involves dry milling and heat treatments to react the component oxides, make the glass uniform and remove moisture and/or bubbles. Minimum heat requirements are 1700 degrees C. for 12 hours. Generally, it is preferred to carry out fusing and fining in separate stages. The first is carried out at a temperature of at least 1300 degrees C. for at least 12 hours. Subsequently the fused material is fined at temperatures between 1700–2000 degrees C. for at least three days. Excellent results are obtained with fining treatments for 450 gm samples in a 3 inch diameter crucible between 1800 and 1850 degrees C. for about five days. Typically, these fining treatments are carried out using an iridium crucible under an inert gas (e.g., argon, other noble gas) to avoid chemical reaction with container materials.

A more detailed procedure for the prepartion of the target material is as follows:

1. The initial ingredients are mixed together generally in a dry, inert atmosphere and then dry milled for an extended period of time.

2. The mixture is melted by heating in an enriched $O_2$ atmosphere at a temperature between 1300 and 1500 for 5 days.

3. The resulting glass is then heated to $1850\pm50$ degrees for about 5 days in an inert atmosphere (e.g., argon). This last procedure removes bubbles from the molten glass.

4. On cooling, the glass is removed and mounted for use in a particle-bombardment deposition apparatus (e.g., e-beam apparatus).

A typical detailed procedure for the preparation of the phosphosilicate glass is as follows: Fine powders of reagent grade $P_2O_5$ and $SiO_2$ are mixed together in a closed polyethylene bottle under conditions that avoid moisture pick up. The amount of $P_2O_5$ used is 110 grams and the amount of $SiO_2$ used is 340 grams. This is the equivalent of 12 mole percent $P_2O_5$ and 88 mole percent $SiO_2$. The ingredients are mixed together in a dry box by combining them in a one liter polyethylene container. Sufficient fused $SiO_2$ cylinders (1 cm diameter and 2 cm long) to fill one-quarter of the jar are then added. The jar is sealed while still in a dry box, removed, placed on a mill and rotated for three days. Fused $SiO_2$ balls are used to avoid contamination and an Argon atmosphere is used to keep the powder dry.

The dry milled mixture is placed in a 4 inch diameter platinum crucible and fused at 1400 degrees C. for 3 days under flowing oxygen (e.g., in a Harper Muffle Furnace). The resulting glass is then core drilled out of the platinum crucible, transferred to a 3 inch diameter iridium crucible and fined, to eliminate bubbles, near 1850 degrees C. for five days under dry, oxygen-free argon (e.g., in an r.f. furnace). The resulting glass has a phosphorus content of about 12 mole percent $P_2O_5$ but the films deposited by e-beam using this glass as a target may have a $P_2O_5$ content closer to 6 mole percent if the semiconductor substrate temperature is high.

The fine glass is core drilled out of a iridium crucible and may be used as cored, as chips or as glass remelted into platinum tubs that fit the e-beam hearth. Typically, the tubs hold about 20 grams of glass each. This remelting is carried out overnight at 1400 degrees C. in an $O_2$-rich atmosphere and is done to provide a smooth, uniformly flat, surface for e-beam evaporation. This also minimizes playing of the electron beam over the copper in the apparatus. Further, deposition may be erratic if the target is a powder or consists of irregular chunks of glass, etc.

The exact glass layer composition used and heat treatment in the fining operation depends on a number of considerations. First of all, a high $SiO_2$ content is desirable and generally other constituents besides $P_2O_5$ are to be avoided because of the uncertainty of their effects on the semiconductor being processed and the process itself. However, up to 10 mole percent elements besides phosphorus and silicon may be incorporated in the glass provided no detrimental effects result. Concentrations of $P_2O_5$ between 3 and 6 mole percent yield excellent results.

The reason for the beneficial effect of phosphorus in the glass layer is not completely understood. It is known that the addition of $P_2O_5$ to $SiO_2$ glass lowers the glass softening temperature and increases the thermal expansion constant. Both of these conditions should reduce stress during thermal anneal procedures, particularly rapid thermal anneal procedures. Also, the presence of phosphorus inhibits further diffusion of (e.g., ion implanted) dopants on annealing, possibly because of the inhibition of out-diffusion of the group III element (gallium in the case of gallium arsenide) in the semiconductor. Even small amounts of $P_2O_5$ (0.5 or 1.0 mole percent) in the glass deposited on the semiconductor surface significantly reduces stress and in many applications, this composition yields excellent results. Higher $P_2O_5$ contents yield still lower stress but above about 15 mole percent, the glass film might not be chemically inert and its barrier characteristics are more uncertain.

When the phosphosilicate layer is used as a barrier layer in an annealing operation, it is preferred that the glass composition be such that the softening temperature of the glass is below the anneal temperature, but the melting point of the equivalent crystalline material be above the anneal temperature. Under these conditions, the glass layer froms a good barrier without stressing the semiconductor surface. FIG. 1 illustrates the variation of glass softening temperature and the equivalent melting temperature with $P_2O_5$ content in teh phosphosilicate glass. Here, crystalline $SiO_2$ has a melting temperature of 1740 degrees C. and fused silica has a softening temperature of 1200 degrees C. In many applications, annealing is desired below 1200 degrees C. (e.g., 900–950 degrees C. for GaAs). By use of the graph in FIG. 1, the amount of $P_2O_5$ needed to reduce the softening temperature to the desired temperature range may be obtained. Typical is 3–10 mole percent.

The glass is prepared starting with as much as twice the mole percent of $P_2O_5$ desired in the e-beam evaporated film. The fusing temperature range is generally between 1300 and 1600 degrees C. (1400±50 degrees C. preferred). Typically, the starting material is 2–12 mole percent $P_2O_5$, and is much the same after heat treatment provided milling is adequate. Deposition of the glass layer may lead to further reduction in phosphorus content to a range of 1–6 mole percent $P_2O_5$ particularly if the semiconductor substrate is heated above 250 degrees C. For the 6 mole percent $P_2O_5$ glass, the deposited film has a softening point of about 800 degrees C. and is highly suitable for use with GaAs being annealed at about 900–950 degrees C.

The glass film is deposited by a variety of procedures involving particle bombardment such as e-beam deposition or sputtering. Generally with sputtering, magnetron sputtering is used and the substrate is located remote fromthe plasma so as to avoid surface damage. Argon is generally used as the gas in the sputtering operation. The preferred deposition procedure is e-beam depositon. Advantages of this procedure are low contamination level, reasonable deposition rates where the structure of the glass is largely preserved and easy provision to control the temperature of the surface on which the deposition is being made. In addition, the semiconductor surface, upon which the glass is deposited, generally is not damaged or otherwise affected by the e-beam procedure.

The e-beam deposition procedure is conventional. Generally, the surfaces of interest are exposed to an aqueous HF solution for a short time (e.g., about 30 seconds), rinsed in deionized water and dried before deposition. The temperature of the surface is between room temperature and 350 degrees C. with 250–300 preferred. Typical e-beam evaporator pressures are less than or equal to $5 \times 10^{-6}$ torr. The thickness of the glass films may vary over large limits including from about 50 to 5000 Angstroms, but for many applications (annealing ion implanted samples) from 300–1500 Angstroms yield excellent results. For less than 300 Angstroms, the anneal procedure sometimes yields undesirable results. Thicker films yield perfectly good results but are often wasteful of time. A particularly good application of the phosphosilicate glass is in the activation step in an ion-implant process. Here, dopant ions are ion implanted into III-V semiconductor compounds. The sample is annealed or heat treated to remove damage caused by the ion implantation and to activate the dopant ions. The phosphosilicate glass is used as the encapsulant in the heat treatment.

A large variety of ions can be used in the ion implantation process. These ions include both n-type (donor) ions and p-type (acceptor) ions. Typical examples of donor ions are silicon, germanium, tin, sulfur, selenium and tellurium. Typical examples of acceptor ions are zinc, cadmium, mercury, beryliu, magnesium and manganese.

A particularly interesting application of the inventive process is in the fabrication of avalanche photodiodes using indium phosphide as the semiconductor material This particular structure has a guard ring to reduce leakage current along the junction edges. Ion implantation, typically with beryllium, is used to produce the junction and guard-ring regions.

FIG. 2 shows a side view of an InP-APD (avalanche photodetector) structure in different stages of fabrication. In FIG. 2A, a side view is shown of the device structure during ion implantation. The figure shows a multilayer structure 31 (not shown in detail) and two layers 32 of epitaxially grown InP. The ion implantation is done in the top InP layers 32. The multilayer structure 31 is typically made up of an n+ InP substrate, typically doped with tin to reduce defects, an epitaxial layer of undoped InP, an epitaxial layer of indium gallium arsenide with composition so that it is lattice matched to InP. The two layers 32 consist of an n+ epitaxial layer of InP doped with sulfur and a top layer of n− (lightly doped) InP.

Ion implantation is carried out into two regions in the top InP layers, one heavily doped to form the diode and electrode region 33, and one lightly doped with acceptor ions to form the guard ring region 34.

In preparation for annealing and activation, a phosphosilicate glass is deposited over the epitaxial layer 32 surface including the regions 33 and 34 that were ion implanted so as to protect the surface during annealing and to limit dopant diffusion during annealing. The $P_2O_5$ content of the glass layer 35 is 4 mole percent, and the thickness of the glass layer is approximately 2000 Angstroms. The depostion is carried out by an e-beam procedure with the surface temperature between 250 and 300 degrees C. Heat treatment for activation involves rapid thermal anneal at a temperature between 800 and 850 degrees C. for about 10 seconds or conventional anneal at typically 700–750 degrees C. for about 10 minutes.

The glass layer is then removed (see FIG. 2C) either by plasma etching or wet etching and then contacts 36 and 37 put down to complete the device. Such devices exhibit extremely high gains with low noise and dark currents. Uniform gains greater than 20 and sensitivities of −35.4 dbm at 1.7 Gbits/second have been obtained.

A number of experiments were carried out using GaAs substrates. The GaAs substrates used in our study were liquid encapsulated Czochralski (LEC) grown, undoped (100) SI-wafers of 5 cm diameter. The procedure was carried out on polished wafers of GaAs. A chemical-mechanical polishing procedure using bromine-methanol was used to remove about 50 $\mu$m of the surface of the wafers. The wafers were then degreased in boiling tricloroethylene, acetone and methanol and rinsed in deionized water. Finally, they were etched for 3 minutes in a freshly prepared solution of $5H_2SO_4:1-H_2O_2:1H_2O$ at 70 degress C., followed by a thorough rinse in deionized water and dried with filtered dry nitrogen.

A veeco MPH-400 implanter equipped with a hot filament source, which provides high beam resolution, was used to implant $^{29}Si^+$ ions at room temperature with doses ranging from $3 \times 10^{12}$ to $5 \times 10^{12} cm^{-2}$ at energies of 60 and 120 keV.

All implanted samples were dipped for ~30 seconds in $1HF:1H_2O$ solution, rinsed in deionized water and dried in filtered nitrogen prior to the dielectric deposition. Films of phosphosilicate glass with thickness between 300 Angstroms and 2500 Angstroms were deposited in an e-beam evaporator equipped with two 1 kW tungsten lamps for radiative heating of the wafers. Deposition of films was performed in a pressure of $\sim 5 \times 10^{-6}$ torr.

The glasses were obtained by high temperure (~1800 degress C.) reaction of high purity $P_2O_5$ and $SiO_2$. Three different glass compositions were prepared, and the phosphorus-to-silicon ratios in the films obtained from these glasses were determined by Rutherford backscattering to be P/Si=4, 7 and 12 percent, respectively. Ellipsometric values of the refractive index for the films were in the range 1.45–1.48

The post implant annealing was carried out in flowing $N_2$ and forming gas mixture with the samples placed with their encapsulated sides up on a quartz susceptor. The films were easily removed in either a $1HF:1H_2O$ solution for about 2 minutes or in a $CF_4$ plasma etcher for about 10 minutes. No peeling-off or blistering of films was observed after annealing up to temperatures in excess of 950 degrees C. Films stored for more than six months did not deteriorate with regard to their ability as effective encapsulants.

Carrier concentration versus depth profiles were determined by the C-V profiling method at the frequency of 10 kHz. The C-V measurements were carried out using a mercury probe to form Schottky barrier contacts. The average mobility $\mu$, sheet resistance $\rho_s$, and sheet carrier concentration $N_s$ were obtained from the Hall-effect measurements using the Van der Pauw technique. Ohmic contacts to the semiconductor were made by alloying Au-Sn-Au at ~420 degrees C. for 6 minutes in forming gas.

Some of the factors that can influence the carrier concentration profiles and doping efficiencies of ion implanted GaAs include the bulk and surface characteristics of the wafer, the ion implant machine, the nature of the dielectric and its thickness, the phenomemon of channeling, annealing temperature and time, and the substrate temperature at which the dielectric is deposited. In our experiments only the preselected GaAs wafers of device quality were used. The implant energies employed were checked with a high-voltage calibration stack supplied by Veeco and the ion dose was calibrated with an Impac I meter. The silicon beam was checked for N, C and O contamination by SIMS analysis of a high dose ($\sim 3 \times 10^{15} cm^{-2}$) implanted GaAs wafer. None of the above impurities were found within the detection limit of $10^{15} cm^{-3}$. In order to minimize channeling, the wafers were mounted such that the ion beam was incident at an angle of 7 degrees with respect to the <100> direction.

The processing parameters that were optimized included the thickness of the glass film, the substrate temperature at which the films were deposited, and the annealing time and temperature.

Figure 3:
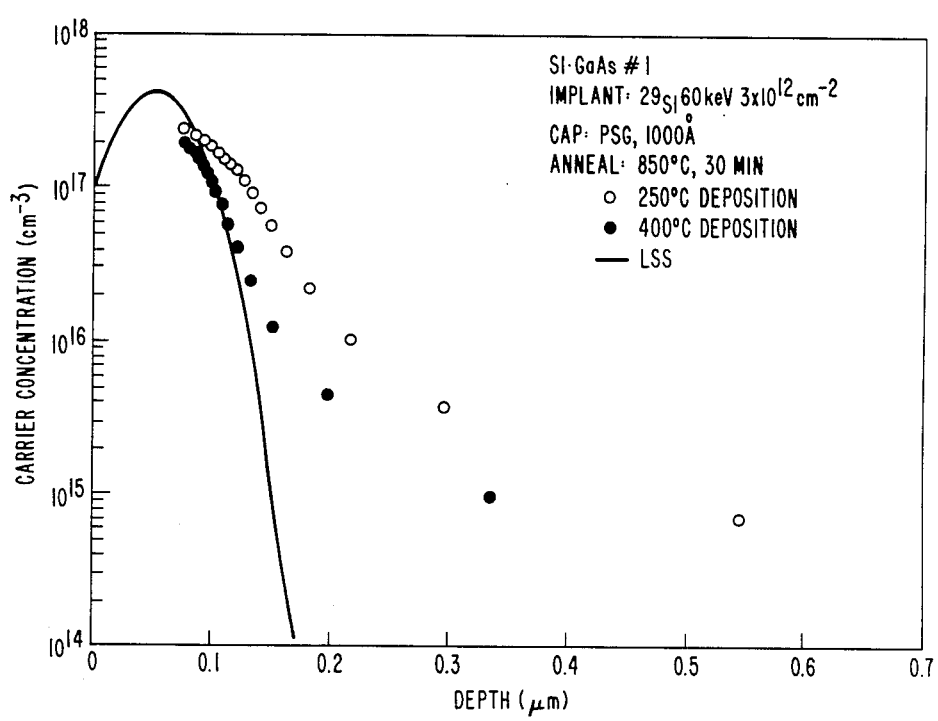
FIG. 3 shows, for various surface temperatures of glass layer depositions, the carrier concentration profiles vs. depth into the semiconductor wafer.

Optimization of deposition temperature was carried out with wafer No. 1 implanted with $3 \times 10^{12}$ ions/cm$^2$ of $^{29}Si$ at 60 keV. The implanted wafer was split into four pieces which were coated with 1000 Angstroms of glass at 250, 300, 350 and 400 degrees C., respectively. They were annealed together at 850 degrees C. for 30 minutes. A comparison of the electron concentration profiles for the 250 and 400 degrees C. depositions are shown in FIG. 3, together with the profile expected theoretically just from the dosage, nature of the implanted ion, acceleration voltage, etc. This is called the LSS profile and is given by the solid line in FIG. 3. Although the peak concentration position $W_0$ for these two profiles were identical (~0.074 $\mu$m), the lower temperature deposition resulted in a profile exhibiting considerable deep tailing. On the other hand, the profiles obtained with the 300, 350 and 400 degrees C. depositions were almost identical and followed closely the LSS curve. These data show that optimum results are obtained with surface deposition temperatures from 300 to about 450 degrees C. Above about 450 degrees C., surface decomposition begins to take place.

Lower surface deposition temperatures can also be used provided the anneal procedure is changed slightly. For example, room temperature deposition can be used provided anneal occurs at 950 degrees C. for 10 seconds (rapid thermal anneal).

Composition of the phosphosilicate glass layers is also important for these processes. A series of experiments were carried out at different P$_2$O$_5$/SiO$_2$ molar ratios. Theses experiments were carried out on a GaAs wafer implanted with $^{29}$Si+ of dose $3\times10^{12}$ cm$^{-2}$ at 60 keV. The implanted wafer was divided into three samples which were capped at 375 degrees C. with 1000 Angstroms films containing P/Si ratios of 0.04, 0.07 and 0.12, respectively. They were annealed together at 850 degrees C. for 30 minutes. The carrier concentration profiles obtained with the films containing 4 anad 7 percent phosphorus were almost identical and closely followed the LSS curve. However, the activation was about 20 percent lower in the case of the film containing 12 percent phosphorus. Glass films with P/Si ratios of 4 and 7 percent yield best results.

The dependence of electrical activation on the cap thickness and annealing temperature was investigated with wafers nos. 3, 4, 5 and 6 which were implanted with $^{29}$Si ions to a dose of $3\times10^{12}$ cm$^{-2}$ at 60 keV and capped at 375 degrees C. with films of 4 mole percent P$_2$O$_5$ and 300, 600, 1000 or 2250 Angstroms thick, respectively. Each wafer was split into four pieces which were then annealed for 30 minutes at the temperatures of 800, 825, 850 and 900 degrees C., respectively. the results are described below.

Figure 4:
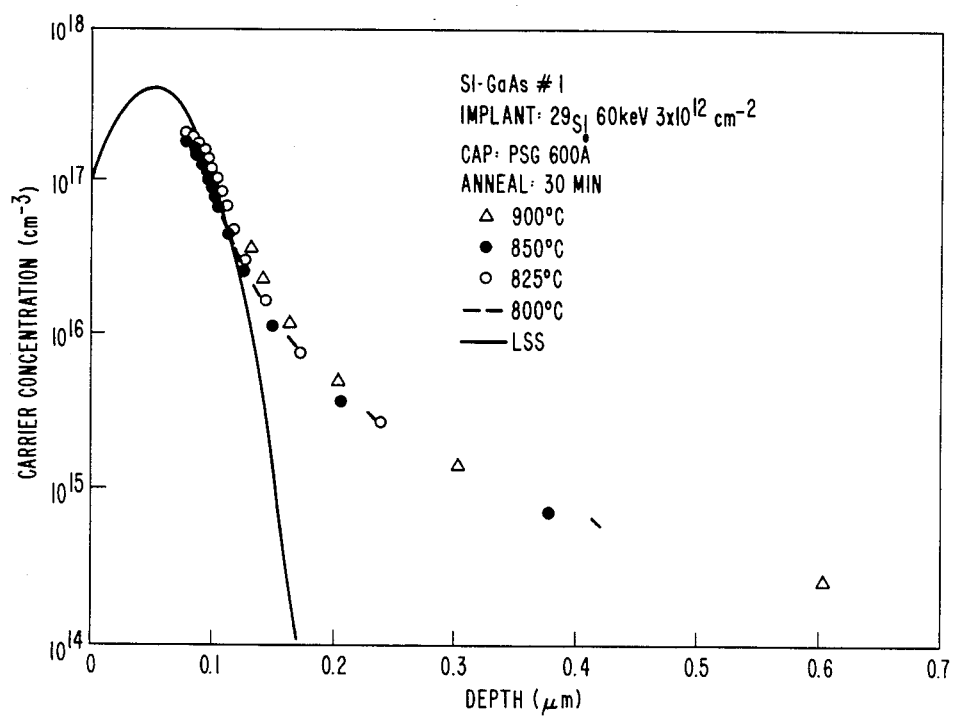
FIG. 4 shows for a 600 Angstroms thick glass layer and various anneal temperatures the carrier concentration profiles vs. depth into the semiconductor wafer.

Our results of annealing the samples encapsulated with 600 Angstroms of PSG are shown in FIG. 4. The theoretical LSS profile for GaAs implanted with $3\times10^{12}$Si ions/cm$^{+2}$ at 60 keV is also shown for comparison purposes. The data indicated that annealing at either 825 degrees C. or 850 degrees C. yielded profiles closest to the LSS curve with a doping efficiency (calculated from the ratio measured to theoretical LSS peak concentrations) of $\sim$57 percent at W$_0\sim$0.074 $\mu$m. The estimated efficiency was $\sim$45 percent for 800 degrees C. anneal. Annealing at 900 degrees C. resulted in a lower activation and profile which deviated from the LSS curve.

Figure 5:
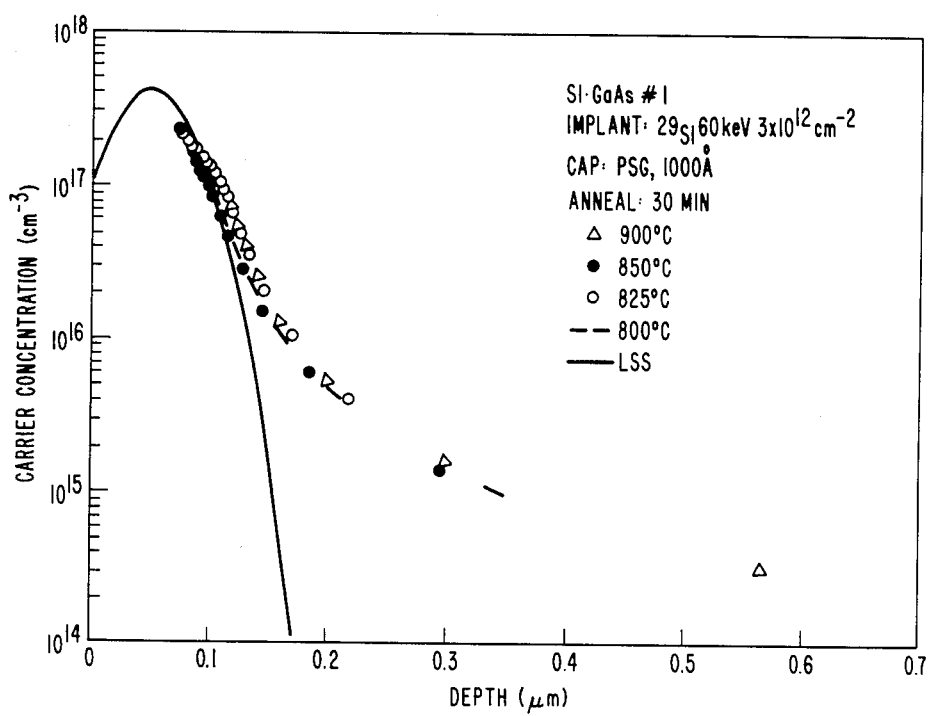
FIG. 5 shows for a 1000 Angstroms thick glass layer and various anneal temperatures the carrier concentration profiles vs. depth into the semiconductor wafer.

FIG. 5 displays the carrier concentration profiles for the implanted samples encapsulated with a 1000 Angstrom film and annealed at different temperatures. The results indicated that while the profiles obtained by annealing at 800, 825, 850 or 900 degrees C. did not deviate significantly from the LSS curve, the best profile and the highest doping efficiency $\simeq$60 percent at W$_0\sim$0.074 $\mu$m resulted from the 850 degrees C. anneal. The annealing at 900 degrees C. yielded a lower activation of $\sim$45 percent.

The carrier concentration profiles of implanted samples annealed with 300 and 2250 Angstrom films of the encapsulant are also of interest. For the thickness of 300 Angstroms electrical activation was observed at 800 and 825 degrees C., but none was detected for the 850 and 900 degrees C. anneals. The profile for the 800 degrees C. anneal showed an activation of 43 percent at W$_0\sim$0.084 $\mu$m. For the 825 degrees C. anneal the profile lay deeper than the LSS curve and the activation at W$_0\sim$0.09 $\mu$m was 40 percent. In the case of the 2250 Aangstroms thick cap, activation was observed only for the 900 degrees C. anneal in whch case the efficiency was estimated to be $\sim$35 percent at W$_0\sim$0.088 $\mu$m. Although various glass layer thicknesses can be used, optimum thickness seems to be about 400–2000 Angstrom units.

What is claimed is:

1. A process for fabricating a device comrising the step of depositing a glass target material on at least a part of a semiconductor surface by a particle beam procedure so that the semiconductor surface is at least partially covered with a contacting glass material region in which the glass material region comprises at least one mole percent P$_2$O$_5$ and at least 60 mole percent SiO$_2$ and the glass material is prepared by a procedure comprising the steps of:
   a. mixing together a substance A comprising P$_2$O$_5$ and a substance B comprising SiO$_2$ to form a mixture; and
   b. heat treating the resulting mixture at a temperature of at least 1700 degrees C. for at least 12 hours.

2. The process of claim 1 in which the particle beam procedure is e-beam deposition.

3. The process of claim 1 in which the semiconductor comprises III-V semiconductor compound.

4. The process of claim 3 in which the III-V semiconductor compound is selected from the group consisting of InP and GaAs and compounds lattice matched to InP and GaAs.

5. The process of claim 1 in which the glass material region comprises 2–8 mole percent P$_2$O$_5$ and at least 82 mole percent SiO$_2$.

6. The process of claim 5 in which the glass material region consists essentially of 3–6 mole percent P$_2$O$_5$, remainder SiO$_2$.

7. The process of claim 1 in which the heat treatment is at a temperature between 1750 and 2000 degrees C. for at least three days.

8. The process of claim 7 in which the heat treatment is carried out in the temperature range from 1800 to 1850 degrees C. for about five days.

9. The process of claim 1 in which the heat treatment is carried out in an iridium crucible in an inert atmosphere.

10. The process of claim 1 in which prior to the heat treatment, the mixture is heated to within a temperature range from 1300–1500 degrees C. for 5 days in an oxygen-enriched atmosphere.

11. The process of claim 1 in which the glass material region contacts an ion implanted surface.

12. The process of claim 11 in which the ion implanted surface with contacting glass material region is annealed to activate the ion implant.

13. The process of claim 12 in which the anneal is rapid thermal anneal at 800–1000 degrees C. for about 10 seconds.

14. The process of claim 12 in which the anneal is carried out at 750–850 degrees C. for about 10 minutes.

15. A device comprising a surface at least partially coated with a phosphosilicate glass layer, said layer fabricated by electron beam deposition from a phosphosilicate glass target material characterized in that the phosphosilicate glass target material used in the electron beam deposition procedure is prepared by a procedure comprising the steps of
   a. mixing together a substance A comprising P$_2$O$_5$ and a substance B comprising SiO$_2$ to form a mixture; and,
   b. heat treating the resulting mixture at a temperature of at least 1700 degrees C. for at least 12 hours.

16. The device of claim 15 in which the device is an avalanche photodiode.

* * * * *